(12) United States Patent
Fleury et al.

(10) Patent No.: US 7,049,817 B2
(45) Date of Patent: May 23, 2006

(54) THERMOSTAT-CONTROLLED CONTAINMENT CELL FOR SAMPLES INTENDED FOR NMR MEASUREMENTS AND METHOD FOR IMPLEMENTING IT

(75) Inventors: Marc Fleury, La Celle Saint Cloud (FR); Françoise Deflandre, Ermont (FR); José Brandely, Savigny sur Orge (FR)

(73) Assignee: Institut Francais du Petrole, Rueil Malmaison Cedex (FR)

( * ) Notice: Subject to any disclaimer, the term of this patent is extended or adjusted under 35 U.S.C. 154(b) by 590 days.

(21) Appl. No.: 10/116,041

(22) Filed: Apr. 5, 2002

(65) Prior Publication Data

US 2002/0147396 A1  Oct. 10, 2002

(30) Foreign Application Priority Data

Apr. 5, 2001  (FR) .................................. 01 04759

(51) Int. Cl.
*G01V 3/00* (2006.01)
*A61B 5/05* (2006.01)

(52) U.S. Cl. ................. 324/315; 324/307; 324/321; 324/318; 600/410

(58) Field of Classification Search ............... 324/315, 324/318, 321, 322, 376; 600/410
See application file for complete search history.

(56) References Cited

U.S. PATENT DOCUMENTS

| | | | | |
|---|---|---|---|---|
| 4,935,714 A | * | 6/1990 | Vermilyea | 505/211 |
| 5,220,302 A | * | 6/1993 | Nunnally et al. | 335/301 |
| 5,397,987 A | * | 3/1995 | Garritano | 324/307 |
| 5,530,353 A | * | 6/1996 | Blanz | 324/315 |
| 6,229,312 B1 | * | 5/2001 | Fleury et al. | 324/376 |
| 6,320,384 B1 | * | 11/2001 | Doty et al. | 324/321 |

(Continued)

FOREIGN PATENT DOCUMENTS

EP   0655629 A1   5/1995

(Continued)

OTHER PUBLICATIONS

European Search Report; Documents Considered Pertinent to Case, FA 600546, FR 0104759 dated Aug. 23, 2001.

*Primary Examiner*—Brij Shrivastav
*Assistant Examiner*—Tiffany A. Fetzner
(74) *Attorney, Agent, or Firm*—Antonelli, Terry, Stout and Kraus, LLP.

(57) ABSTRACT

A thermostatically controlled containment cell for a sample, suitable notably for a measuring device such as a nuclear magnetic resonance (NMR) spectrometer, NMR type measuring device including the cell, and method for implementation is disclosed. Cell (8) comprises a body of a tubular sleeve (9) made of a material so selected as not to interfere with NMR measurements, (for example a non-magnetic and non electrically conducting material) ending at its opposite ends with terminal parts (14, 16), containing a sample (S), and means (19–22) for circulating within tubular sleeve (9) a controlled-temperature heat carrier for maintaining the sample at a substantially constant temperature during measurements which liquid is selected to not disturb the NMR measurements. The cell containing the sample is first heated by circulation of the heat carrier. An overpressure sufficient to prevent boiling is established in the cell. The cell can then be introduced into or removed from the NMR measuring device without stopping the circulation of the heating fluid. Applications notably are calibration of logging measurements on geologic samples or others.

12 Claims, 2 Drawing Sheets

U.S. PATENT DOCUMENTS

| | | | |
|---|---|---|---|
| 6,329,820 B1 * | 12/2001 | Hasegawa et al. | 324/315 |
| 6,507,191 B1 * | 1/2003 | Eguchi et al. | 324/318 |
| 6,838,880 B1 * | 1/2005 | Hofmann et al. | 324/318 |
| 2002/0147396 A1 * | 10/2002 | Fleury et al. | 600/410 |

FOREIGN PATENT DOCUMENTS

| | | |
|---|---|---|
| EP | 0974839 A1 | 1/2000 |

\* cited by examiner

THERMOSTAT-CONTROLLED CONTAINMENT CELL FOR SAMPLES INTENDED FOR NMR MEASUREMENTS AND METHOD FOR IMPLEMENTING IT

BACKGROUND OF THE INVENTION

1. Field of the Invention

The present invention relates to a thermostat-controlled containment cell for a sample, suitable notably for a measuring device such as a nuclear magnetic resonance (NMR) spectrometer, to a NMR type measuring device including the cell and to a method of implementation.

2. Description of the Prior Art

Nuclear magnetic resonance (NMR) measuring devices conventionally comprise magnets and coils placed in the air gap of the magnets. An oscillating electric field (generally in the radio frequency range) is applied to the sample subjected to the magnetic field by connecting the coil to a variable-frequency signal generator, and the response of the sample to the excitation signals is recorded. In order to stabilize the magnetic field created by the magnets, their temperature is stabilized by establishing a forced air circulation and by interposing between the magnets and the excitation coil a cooling circuit in which a fluid circulates.

Within the scope of measuring operations, it is useful first to bring the sample to a predetermined temperature. This is for example the case for laboratory calibration of measurements performed by means of NMR logging sondes at various depths of underground zone exploration wells. It is therefore possible to place the sample for example in a thermoregulated vessel prior to transferring it in the air gap when measurements are to be performed. However, it is then difficult to maintain the sample at a really constant temperature. The solution of exposing the sample in the air gap, to a controlled-temperature gas stream is generally not satisfactory.

SUMMARY OF THE INVENTION

The containment cell according to the invention affords the advantage of maintaining the sample to be measured at controlled temperature without any temperature regulation break between a preliminary warming up stage (outside the measuring device) and the setting and measuring stage.

The cell comprises a body of a tubular sleeve made of a material so selected as not to interfere with NMR measurements (made of a non-magnetic and non electrically conducting material for example) and ending at opposite ends thereof with terminal parts, containing a sample, and means for circulating in the tubular sleeve a controlled-temperature heat carrier liquid for maintaining the sample at a substantially constant temperature during measurement, the liquid being so selected as not to disturb the NMR measurements.

It also preferably comprises means for establishing an overpressure in the cell at a sufficient temperature to prevent boiling.

The implementation method allows conditioning at a substantially constant temperature a sample intended for tests in a nuclear magnetic resonance (NMR) device. It comprises:

first heating the sample to the required temperature in a thermostat-controlled containment cell comprising a body of a tubular sleeve made of a material so selected as not to interfere with NMR measurements (made of a non-magnetic and non electrically conducting material for example), ending at opposite ends thereof with terminal parts, containing the sample, and means for circulating in the tubular sleeve a controlled-temperature heat carrier liquid for maintaining the sample at a substantially constant temperature throughout the measurements, the liquid being so selected as not to disturb the NMR measurements, and transferring the cell into the device without interrupting the circulation of the heat carrier liquid in the tubular sleeve.

The device for carrying out NMR type measurements on samples comprises a nuclear magnetic resonance apparatus including magnets, coils placed in the air gap of the magnets, a device in the form of an electronic box for generating the excitation signals creating an oscillating electric field (in the radio frequency range for example) and for acquiring the response of the sample to the excitation signals, a first tubular sleeve arranged outside the coils and connected to a circuit in which a controlled-temperature cooling fluid circulates. The device also comprises a containment cell suited to be placed in the coils, comprising a body of a second tubular sleeve made of a material so selected as not to interfere with the NMR measurements (made of a non-magnetic and non electrically conducting material for example), ending at opposite ends thereof with terminal parts between which a sample is arranged, and means for circulating in the tubular sleeve a controlled-temperature heat carrier liquid for maintaining the sample at a substantially constant temperature during measurement, the liquid being so selected as not to disturb the NMR measurements.

The device preferably comprises means for establishing an overpressure in the cell, sufficient to prevent boiling.

According to an implementation mode, the device also comprises means for establishing a fluid circulation through the sample in the cell.

BRIEF DESCRIPTION OF THE DRAWINGS

Other features and advantages of the cell and of the device including the cell will be clear from reading the description hereafter of a non limitative example, with reference to the accompanying drawings wherein.

DETAILED DESCRIPTION OF THE INVENITON

Figure 2:
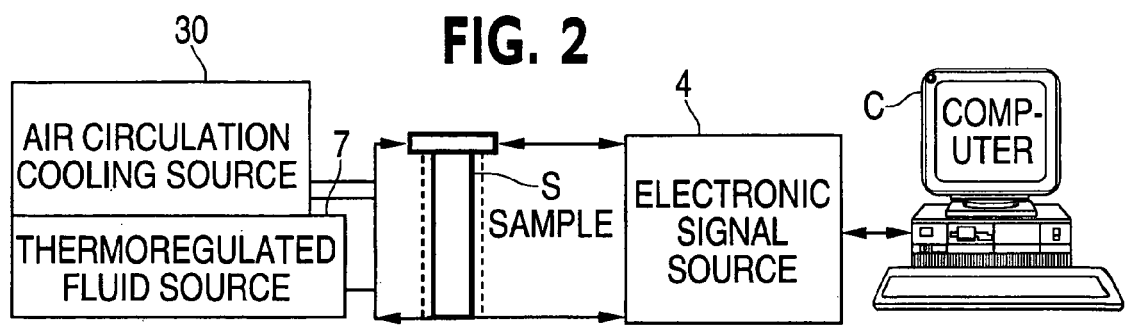
FIG. 2 diagrammatically shows the NMR measuring device with the operating equipments.
Figure 1:
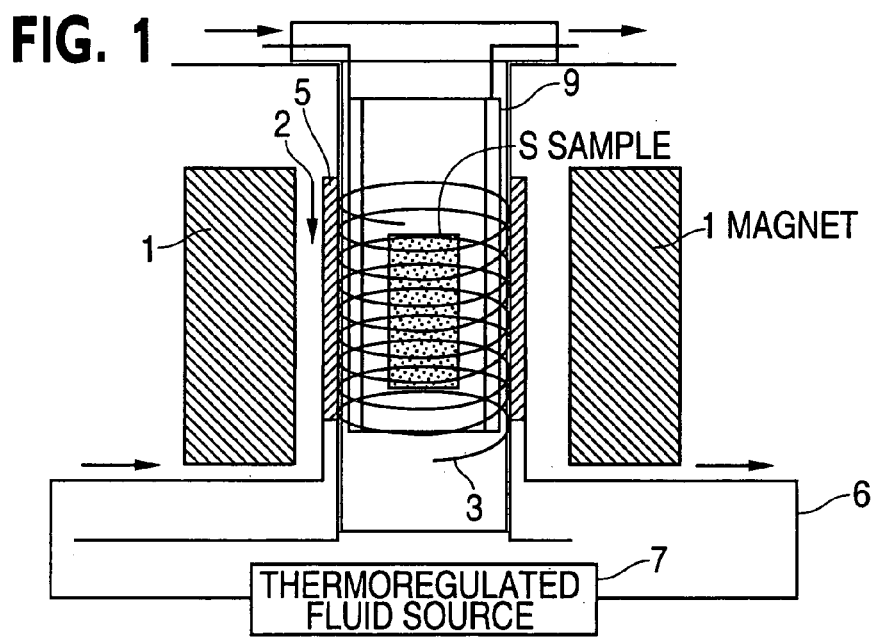
FIG. 1 diagrammatically shows the cell in the air gap of a NMR measuring device.
Figure 5:
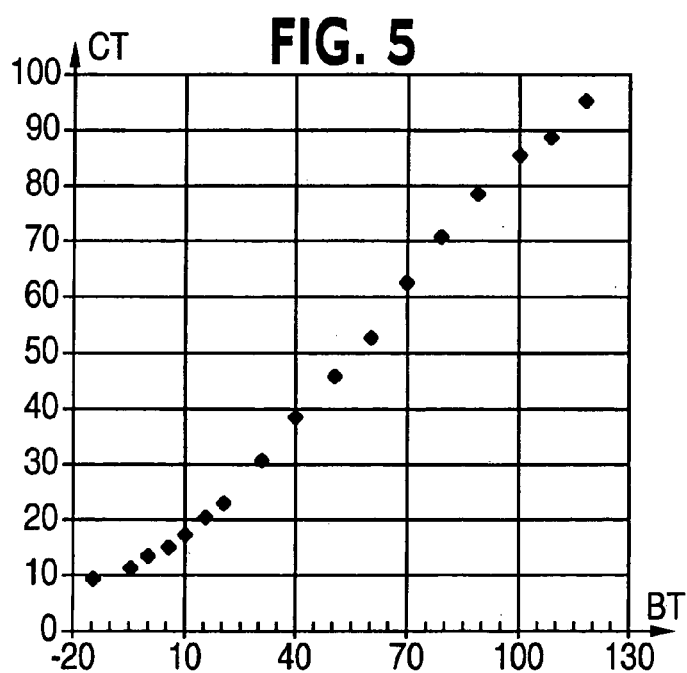
FIG. 5 shows the relation between temperature BT of the heating fluid circulating around the cell and temperature CT inside the cell.

The NMR measuring device conventionally comprises (FIGS. 1, 2) magnets 1 with an air gap 2 in which coils 3 containing sample S are arranged. The coils are connected to an electronic signal source 4 for generating the excitation signals (signals in the radio frequency range for example) creating an oscillating electric field and for acquiring the response of sample S to the excitation signals. A magnetic tubular sleeve 5 connected to a circuit 6 (FIG. 2) in which circulates a first controlled-temperature cooling fluid (water for example) supplied by a thermoregulated fluid source 7 is arranged in air gap 2 outside coils 3. Electronic signal source 4 is controlled by a computer C. The device can also conventionally comprise an air circulation cooling source 30 for establishing an air circulation cooling intended to cool the magnets.

Figure 3:
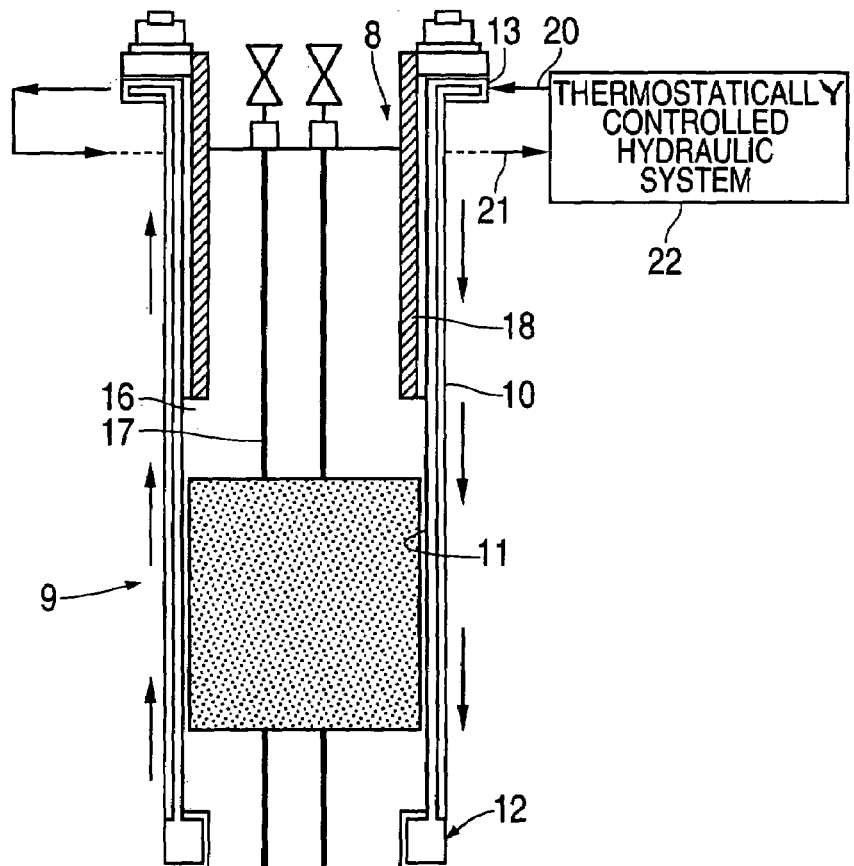
FIG. 3 diagrammatically shows the containment cell with its permanent circulating-fluid heating circuit.

Containment cell 8 is suited to be inserted within coils 3. It comprises (FIG. 3) a hollow tubular sleeve 9 of two nested tubes 10, 11 of different diameters, ending at a first end with a stop 12 and at the opposite end with an annular shoulder 13. A first terminal part 14 which is crossed by lines 15 and resting against end stop 12, is arranged in tubular sleeve 9. Sample S is arranged in tubular sleeve 9 between first terminal part 14 and a second terminal part 16 also crossed right through by lines 17. Second terminal part 16 is pressed against sample S by a tubular crossbar 18 fastened to the annular shoulder 13 of cell 8. Lines 15, 17 allow to establish in the cell, if necessary, a static pressure sufficient to prevent boiling of the fluids saturating sample S.

Lines 15, 17 can also be possibly connected to a pumping assembly (not shown) allowing to displace fluids within porous samples, as described for example in patent EP-974,839 filed by the applicant.

Figure 4:
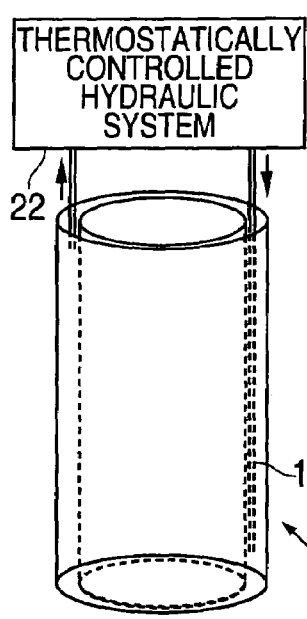
FIG. 4 diagrammatically shows a detail of the fluid supply circuit.

A channel 19 (FIG. 4) is provided between the two tubes 10, 11 all along sleeve 9, and it opens onto a first end thereof. Supply lines 20, 21 coming from a thermostat-controlled hydraulic system 22 are connected to channel 19 and to the opposite end of sleeve 9 respectively. They supply lines 20, 21 allow circulation in the sleeve of a heat carrier fluid so selected as not to disturb the NMR measurements, such as a fluorinated fluid.

Sample S can first be homogeneously brought to the suitable temperature for measurement in the NMR measuring device. It is therefore placed in containment cell 8 and a circulation of the heat carrier fluid is established until the desired temperature is reached. It is also possible to bring it to the desired temperature by placing cell 8 in a thermostat-controlled oven (for example prior to connection to hydraulic system 22) providing temperature maintenance during measurement. At the appropriate time, the cell is directly introduced into the coils of air gap 2 without requiring interruption of the heating fluid circulation.

The invention claimed is:

1. A removable thermostatically controlled containment cell configured for preconditioning at a predetermined temperature a sample prior to measurements in a nuclear magnetic resonance spectrometer comprising:
   magnets;
   coils placed in an air gap of the magnets allowing generation of a modulated magnetic field;
   a tubular sleeve made of a material which does not interfere with nuclear magnetic resonance measurements, ending at opposite ends thereof with terminal parts between which a sample is arranged; and
   means for circulating in the tubular sleeve a controlled temperature heat carrier fluid in order to bring the sample to a predetermined temperature, substantially constant during measurement; and wherein
   the heat carrier fluid does not disturb the nuclear magnetic resonance measurements and the sleeve is introducible inside the coils without stopping a circulation of the heat carrier fluid.

2. A cell as claimed in claim 1, comprising means for establishing in the containment cell an overpressure sufficient to prevent a fluid saturated sample from boiling.

3. A cell as claimed in claim 1, wherein the body of the containment cell is made of a non-magnetic and non electrically conducting material.

4. A cell as claimed in claim 2, wherein the body of the containment cell is made of a non-magnetic and non electrically conducting material.

5. A method for conditioning at a substantially constant temperature a sample to be tested in a nuclear magnetic resonance device, comprising:
   first heating the sample to a required temperature in a thermostatically controlled containment cell comprising a body of a tubular sleeve made of a material which does not interfere with nuclear magnetic resonance measurements, ending at opposite ends thereof with terminal parts, containing the sample, and means for circulating in the tubular sleeve a controlled temperature heat carrier fluid for bringing or maintaining the sample at a predetermined temperature throughout the nuclear magnetic resonance measurements, the heat carrier fluid not disturbing the nuclear magnetic resonance measurements; and
   transferring the containment cell into the nuclear magnetic resonance device without interrupting the heat carrier fluid circulation in the tubular sleeve.

6. A device configured for making nuclear magnetic resonance measurements on samples, comprising:
   a nuclear magnetic resonance apparatus including magnets, coils placed in an air gap of the magnets, an excitation signal generator and signal acquirer for generating the excitation signals creating an oscillating electric field and for acquiring a response of a sample to the excitation signals;
   a first tubular sleeve outside the coils and connected to a circuit in which a controlled temperature cooling fluid circulates;
   a removable thermostatically controlled containment cell for preconditioning at a predetermined temperature a sample prior to nuclear magnetic resonance measurements in the nuclear magnetic resonance apparatus;
   a tubular sleeve made of a material, which does not interfere with nuclear magnetic resonance measurements, ending at opposite ends thereof with terminal parts between which the sample is arranged;
   means for circulating in the tubular sleeve a controlled temperature heat carrier fluid in order to bring the sample to a predetermined temperature, substantially constant during measurement, the heat carrier fluid not disturbing the nuclear magnetic resonance measurements; and
   the sleeve being introducible inside the coils without stopping a circulation of the heat carrier fluid.

7. A device as claimed in claim 6, wherein the containment cell is made of a non-magnetic and non electrically conducting material.

8. A device as claimed in claim 6, comprising means for establishing inside the containment cell an overpressure sufficient to prevent a fluid saturated sample from boiling.

9. A device as claimed in claim 7, comprising means for establishing inside the containment cell an overpressure sufficient to prevent a fluid saturated sample from boiling.

10. A device as claimed in claim 7, comprising means for establishing inside the containment cell a heat carrier fluid circulation.

11. A device as claimed in claim 8, comprising means for establishing inside the containment cell a heat carrier fluid circulation.

12. A device as claimed in claim 9, comprising means for establishing inside the containment cell a heat carrier fluid circulation.

* * * * *